United States Patent
Yun et al.

[11] Patent Number: 5,728,593
[45] Date of Patent: Mar. 17, 1998

[54] POWER INSULATED-GATE TRANSISTOR HAVING THREE TERMINALS AND A MANUFACTURING METHOD THEREOF

[75] Inventors: Chong-Man Yun; Min-Koo Han; Kwang-Hoon Oh; Deok-Joong Kim, all of Seoul, Rep. of Korea

[73] Assignee: Samsung Electronics Co., Ltd., Suwon, Rep. of Korea

[21] Appl. No.: 496,696

[22] Filed: Jun. 29, 1995

[30] Foreign Application Priority Data

Dec. 29, 1994 [KR] Rep. of Korea ............... 94-38881

[51] Int. Cl.$^6$ ........................... H01L 21/265
[52] U.S. Cl. ............... 437/29; 437/26; 437/27; 437/31; 437/41 RBP
[58] Field of Search ............... 437/27, 41 RBP, 437/29, 31, 26

[56] References Cited

U.S. PATENT DOCUMENTS 4,810,665  3/1989  Chang et al. .............. 437/27
5,023,191  6/1991  Sakurai .................... 437/27
5,084,401  1/1992  Hagino ..................... 437/31
5,164,327  11/1992 Maruyama ................. 437/27

Primary Examiner—Trung Dang
Attorney, Agent, or Firm—Cushman Darby & Cushman, IP Group of Pillsbury Madison & Sutro LLP

[57] ABSTRACT

The present invention relates to a method of manufacturing an insulated-gate transistor including a very thin P$^-$ layer as a channel under a gate terminal. The device and method differs from conventional devices and techniques in that the P$^-$ regions are formed by double diffusion. Secondly, the present invention includes channel regions by forming the N$^+$ regions in the middle of the shallow P$^-$ layer causing the resistance of the JFET regions to be reduced. High-speed operation of the device can be obtained by reducing the input and reverse capacitances which thereby reduces the time delay when power is supplied. The forward voltage drop is reduced by reducing the resistance of the first conductive semiconductor region which is determined by the distance between the second conductive type semiconductor region in its forward turn-on state.

9 Claims, 11 Drawing Sheets

POWER INSULATED-GATE TRANSISTOR HAVING THREE TERMINALS AND A MANUFACTURING METHOD THEREOF

BACKGROUND OF THE INVENTION

1. Field of the Invention

The present invention relates to an insulated-gate transistor (IGT). More particularly, the present invention relates to a method of manufacturing an insulated-gate transistor having a new structure which improves the forward bias operating characteristics of a device by reducing a JFET region effectively formed in an insulated-gate transistor.

2. Description of the Related Art

An insulated-gate transistor (IGT), which is one type of bipolar transistor having a metal-oxide semiconductor (MOS) structure is frequent used in power conversion and power control systems requiring large capacity power transfer and high-speed switching. This type of IGT is called a conductivity-modulated field effect transistor (COMFET). When in the forward-biased operating state, an IGT used as a power switching device should be designed to make the forward voltage drop small and high speed switching operations possible.

Conventionally, an insulated-gate transistor is a device having three terminals including a collector, an emitter and a gate. A collector electrode is formed on the bottom of a semiconductor substrate and an emitter electrode and a gate electrode are formed on the surface of the semiconductor substrate.

The structure of the insulated-gate transistor will be apparent from the following detailed description in connection with the accompanying drawings.

FIG. 1 is a cross-sectional view of a conventional insulated gate transistor. A collector electrode 2000 is formed on the bottom of P$^+$-type substrate 1000 and an N-type epitaxial layer 5000 is formed on the upper portion of P$^+$ type substrate 1000. P$^+$ region 5100 is formed in the surface of N-type epitaxial layer 5000 and low density P$^-$ region 5200 is formed on the edge of P$^+$ region 5100 by using double diffusion. Two separated N$^+$ regions 5300 are formed in P$^+$ region 5100. A gate insulating layer 4100 and a gate electrode 4000 are formed on epitaxial layer 5000. Gate electrode 4000 and gate insulating layer 4100 are then covered with PSG film 4200.

Finally, emitter electrode 3000 is formed on PSG film 4200 and connected to N$^+$ regions 5300 and the P$^+$ region 5100. In this case, reference character "x" is half of the distance between P regions of adjacent transistors, and reference character "y" indicates the junction depth of the P$^+$ region.

The structure of the insulated-gate transistor appears to be identical to that of a MOS gate thyristor. However, its operation is fundamentally different in that the insulated-gate transistor structure is designed to prevent the regenerative turn-on in the inherent four-layer thyristor structure.

Since the junction of P$^+$ type substrate 1000 and N-type epitaxial layer 5000 is forward-biased in the on-state, current flows through the epitaxial layer and the channel. This allows fully gate-controlled output characteristics with forced gate turn-off capability.

In this structure, current flow cannot occur when a negative voltage is applied to collector electrode 2000 with respect to emitter electrode 3000 because the junction of substrate 1000 and epitaxial layer 5000 will become reverse-biased.

When a positive voltage is applied to the collector electrode 2000 with gate electrode 4000 short-circuited to emitter electrode 3000, the junction of N$^-$ type epitaxial layer 5000 and P$^+$ region 5100 becomes reverse-biased and the device operates in a forward blocking mode. When the device operates in the forward blocking mode, the gate bias is removed and the drain is biased, thereby preventing current from flowing in the channel and applying a large voltage to the P/N$^-$ epitaxial layer junction.

With positive collector voltages, if a positive gate bias is applied with sufficient magnitude to form an inversion layer under the gate electrode in the P$^-$ region 5200, the device operates in its forward conducting state because electrons can flow from the emitter N$^+$ region 5300 to N$^-$ type epitaxial layer 5000.

While in the forward conducting state, the junction of substrate 1000 and epitaxial layer 5000 becomes forward-biased and the P$^+$ region of the substrate 1000 injects holes into N$^-$ epitaxial layer 5000.

As the forward bias is increased, the injected hole density increases relative to the background doping level and modulates the conductivity of N$^-$ type epitaxial layer 5000. In this case, a significant voltage drop will occur across this region as is observed in a conventional MOSFET. At this time, the forward current will saturate.

To switch the insulated-gate transistor from its on-state to the off-state, it is necessary to discharge the gate electrode 4000 by short-circuiting it to the emitter electrode 3000. In the absence of a gate voltage, the inversion layer at the surface of P$^-$ region 5200 under gate electrode 4000 cannot be sustained. Removal of the gate bias cuts off the supply of electrons to epitaxial layer 5000 and initiates the turn-off process. In the presence of a high density of minority carriers injected into N$^-$ type epitaxial layer 5000 during forward conduction, the turn-off does not occur abruptly. The collector current decays gradually with a characteristic time constant determined by the minority carrier lifetime.

The advantageous features offered by the insulated-gate transistor are its high forward conduction current density, low drive power due to the MOS gate structure, fully gate controlled output characteristics with gate turn-off capability, and a unique reverse blocking capability. These characteristics approach those of an ideal power switch suitable for many direct current (DC) and alternating current (AC) power control circuits.

Furthermore, it has the advantages of low resistance, high-speed switching, and a high breakdown voltage.

The insulated-gate transistor contains a parasitic P-N-P-N thyristor structure between collector electrode 2000 and emitter electrode 3000. If the current density in the normal state approaches a critical value, this thyristor latches up easily and the current can no longer be controlled by the MOS gate. A latch-up occurs in the following situation.

An IGBT determines the turning-on or turning-off of the current according to whether the gate voltage is applied when the voltage is applied between the emitter and collector. However, when the current increases distinctly, the parasitic PNPN thyristor is turned on and the IGBT becomes uncontrollable.

It is well known that the hole current flowing underneath the N$^+$ source (shown in FIG. 1, reference numeral 5300) causes the voltage to drop and invokes the latch-up phenomenon. Therefore, in order to suppress the latch-up, it is desirable to reduce the hole current which flows underneath the N$^+$ source.

The hole current may be decreased with an increase of the distance between the P body (shown in FIG. 1, reference numeral "X"), but, in that case, the forward voltage drop is also increased. In the present invention, the IGBT exhibits a low forward voltage drop even though the distance between the adjacent P regions is short.

Therefore, it is important to design the device in a manner which suppresses the thyristor action. This can be achieved by preventing the injection of electrons from $N^+$ regions 5300 into $P^+$ region 5100 during device operation. The emitter $N^+$ region 5300 will begin to inject electrons into $P^+$ region 5100 if the $N^+/P^+$ junction becomes forward-biased by more than 0.7 V as the result of any lateral current flow in $P^+$ region 5100. This injection can be suppressed by designing emitter $N^+$ region 5300 to be narrow and keeping $P^+$ region 5100 resistivity low to suppress latch-up. In order to minimize this resistivity, the resistivity of the P-region and source (emitter in a parasitic NPN transistor) length should be reduced.

In this vertical IGT, the forward voltage drop between the collector and the emitter in its turn-on state should be kept at a minimum. This forward voltage drop can be divided into the voltage drop in the channel region, in the JFET structure, and in the epitaxial layer respectively.

A conductivity-modulated effect occurs in epitaxial layer 5000 because the minority carriers are injected from substrate 1000 to epitaxial layer 5000, thus causing the voltage drop in epitaxial layer 5000 to be small. Consequently, the voltage drop in JFET region 4300 is relatively important because the voltage drop in the epitaxial layer is small compared to the total forward voltage drop.

The JFET region is determined by the distance between one $P^-$ region and the other $P^-$ region (2 times "x") and the junction depth (y) as shown by reference numeral 4300. It is necessary to make the distance between the $P^+$ regions wide and make the $P^+N^-$ junction deep in order to reduce the voltage drop.

However, in the conventional technique, if the junction depth of the $P^+$ region decreases, a resistance element under the emitter region increases and the latch-up phenomenon occurs as a result of the minority carrier current. The channels are formed by using the method of double diffusion which demands a minimum junction depth to make a predetermined channel length.

If the distance between the $P^+$ regions widens, the turn-off time is increased as a result of reducing a MOS current and the latch-up phenomenon occurs as a result of an increasing hole current.

In the conventional IGT, there is a JFET region length (as shown by reference numeral 4300 in FIG. 1) having a minimum on-resistance. It is also desirable to reduce the size of a unit cell so as to increase the current density and prevent the latch-up phenomenon.

However, in this structure, it is difficult to adjust the channel length because the channel length is determined by the junction depth of the $P^+$ region. It is also difficult to keep a threshold voltage constant because the impurity density changes horizontally and is vulnerable to small disturbances during the process.

SUMMARY OF THE INVENTION

To solve the technical problems associated with the conventional device, it is an object of the present invention to improve the characteristics of the IGT having a channel length which is shorter than the optimal JFET region length used in the conventional technique. In this manner, although "x" is shorter, the voltage drop does not increase sharply. This is because the JFET resistance is determined by the distance between the P regions ("X") and the P region function depth "Y". The JFET resistance is decreased in response to a decrease in "Y" and an increase in "X". In the present invention, "X" is increased by eliminating the P-region under the channel region and the JFET resistance is reduced so that the effect of the JFET resistance on the forward voltage drop is reduced. The benefits of a low forward drop are that conduction loss is reduced and power is conserved.

It is another object of the present invention to provide an insulated-gate transistor and a method for manufacturing the same.

In accordance with the present invention, the insulated-gate transistor includes a very thin $P^-$ layer used as a channel under a gate terminal of a device which is different from that of the conventional technique in which the $P^-$ regions are formed by using double diffusion.

Secondly, the IGT includes channel regions which are established by forming the $N^+$ regions in the middle of the shallow $P^-$ layer. In these channel regions, the voltage drop is reduced, an electron current passing through the channel is to be injected into the epitaxial layer and, the resistance in the JFET region is reduced.

Thirdly, the operation speed of the IGT device can be increased by reducing the length of the gate electrode region which also has the effect of reducing the input capacitance and the reverse capacitance of the device.

To achieve the above object, the insulated-gate transistor of the present invention is a power insulated-gate transistor having three terminals and comprising a second conductive type semiconductor substrate having a first conductive type semiconductor layer.

The present invention consists of a first region doped with a high density second conductive type impurity and formed abutting the surface of the semiconductor layer; a plurality of second regions doped with a high density first conductive type impurity and formed within the first region abutting the surface of the semiconductor layer; a plurality of third regions doped with a low density second conductive type impurity and formed in the semiconductor layer on either side of the first region; and a plurality of fourth regions doped with a high density first conductive type impurity formed in the middle of each third region and more deeply formed than the second regions in the semiconductor layer. There is also a field oxide film formed in the upper portion of the fourth regions.

In manufacturing the power insulated-gate transistor having three terminals and according to the present invention, there is a first step of forming a first region by injecting a high density second conductive type impurity into the semiconductor layer formed on the substrate; a second step of forming a number of second regions by injecting a low density second conductive type impurity into the semiconductor layer; a third step of forming an insulating layer and a conductive layer by depositing insulating materials and conductive materials on the semiconductor layer; a fourth step of forming openings on the upper portion alongside the first region by patterning the insulating layer and the conductive layer; a fifth step of injecting the high density first conductive type impurity into the semiconductor layer through the openings made in the fourth process; a sixth step of forming the third and fourth regions by diffusing the impurities injected in the second and fifth steps, and at the same time, for forming the fourth region more deeply than the third region.

On the other hand, the power IGT having three terminals may also be manufactured through a first number of steps comprising: a first step of forming a first region by injecting a high density second conductive type impurity into the semiconductor layer formed on the substrate; a second step of injecting a low density second conductive type impurity into the semiconductor layer; a third step of injecting the high density first conductive type impurity on either side of the first region; a fourth step of forming a plurality of third regions and a plurality of fourth regions by diffusing the impurities injected in the second and third steps which at the same time forms the fourth region deeper in the semiconductor layer than the third region.

The present invention can also be manufactured in a second manner by using the following steps: a first step of forming an insulating layer doped with a second conductive type impurity on a semiconductor layer which in turn is formed on the substrate; a second step of forming a number of openings in the insulating layer by patterning the insulating layer; a third step of injecting a high density second conductive type impurity into the semiconductor layer through the openings formed in the second step; a fourth step of forming a high density first region on the semiconductor layer under the openings made in the second step by diffusing the impurities injected in the third step; a fifth step of forming a number of low density third regions more shallowly than the first region on the semiconductor layer under the insulating layer; and a sixth step of forming a number of fourth regions more deeply than the third regions by injecting a high density first conductive type impurity into the middle of the third regions; also in the sixth step, the second regions can be formed more shallowly than the first regions by injecting a first conductive type impurity into the first regions.

A third manufacturing method in accordance with the present invention can be performed using: a first step of depositing an oxide semiconductor layer and a silicon nitride semiconductor layer respectively on the semiconductor layer which is formed on the substrate; a second step of forming a number of openings by etching the oxide semiconductor layer and the silicon nitride semiconductor layer; a third step of injecting a high density first conductive type impurity into the semiconductor layer and the silicon nitride semiconductor layer through the openings made in the second step; a fourth step of forming an oxidized field oxide film-on the exposed semiconductor layer through the openings by oxidizing structure formed by the third step and also forming a plurality of fourth regions by diffusing the impurity injected in the third step; a fifth step of removing the silicon nitride semiconductor layer; a sixth step of forming a first region by injecting and diffusing a high density second conductive type impurity into the semiconductor layer; a seventh step of removing the oxide semiconductor layer; an eighth steps of injecting a low density first conductive type impurity into the semiconductor layer; a ninth step of forming an insulating layer by depositing insulating materials on the semiconductor layer; a tenth step of forming a gate electrode by depositing conductive materials on the insulating layer; an eleventh step of forming openings in the insulating layer by etching the insulating layer above the first region; and a twelfth step of forming a number of second regions by injecting a high density first conductive type impurity through the openings into the first region.

Additionally, in performing this manufacturing method, it is desirable to use a Local Oxidation Of Silicon (LOCOS) procedure for the fourth oxidizing step.

By using the manufacturing steps recited above, the IGT of the present invention is able to reduce the resistance of the JFET region which is considered a problem in the conventional structure of a vertical IGT. The above manufacturing methods also make a high-speed operation of the device possible by reducing the input and reverse capacitances.

BRIEF DESCRIPTIONS OF THE DRAWINGS

Additional advantages and objectives of the present invention will be apparent in the following detailed description in connection with the accompanying drawings, in which.

Figure 6A:
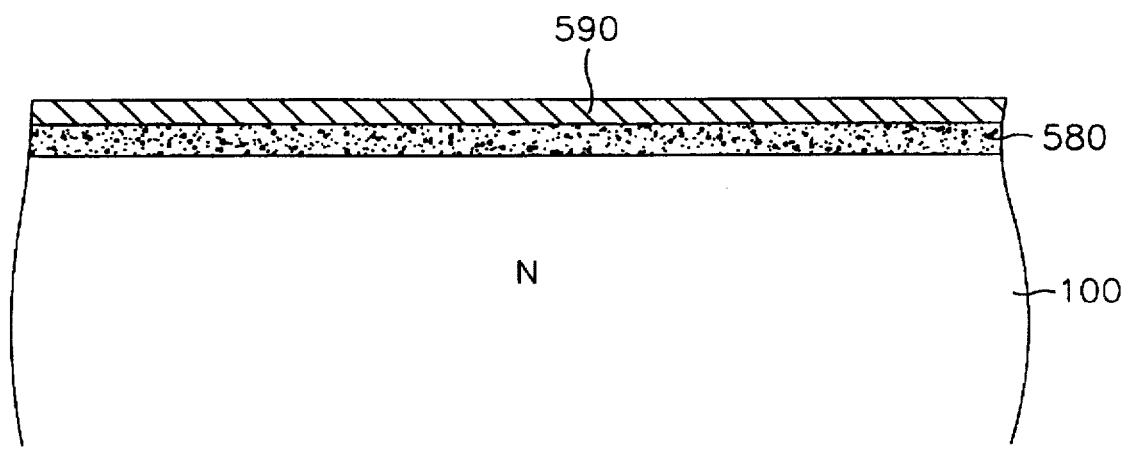
Figure 6B:
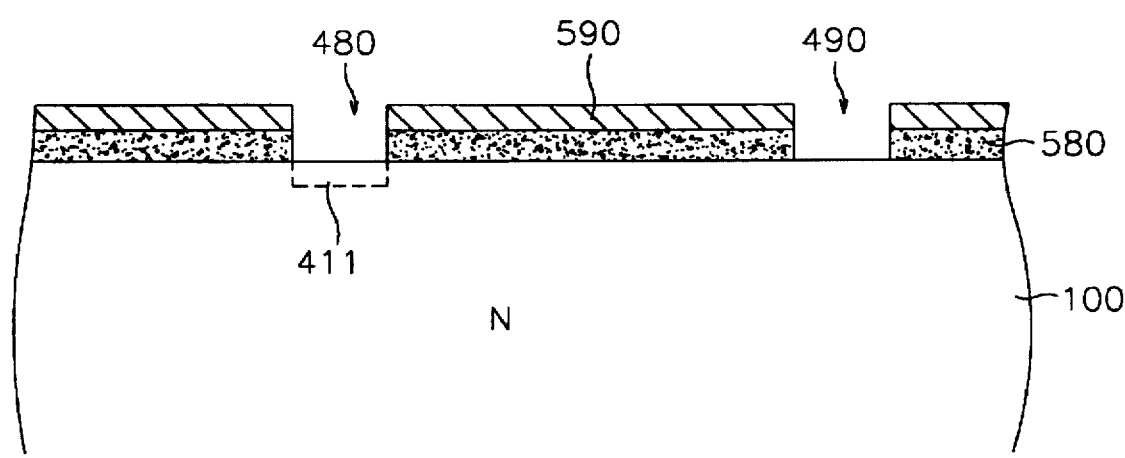
Figure 6C:
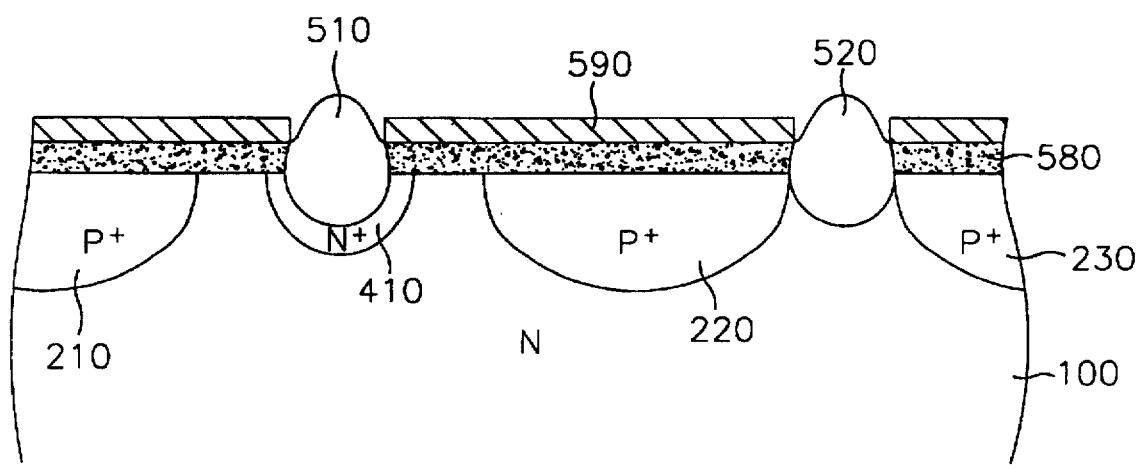
Figure 6D:
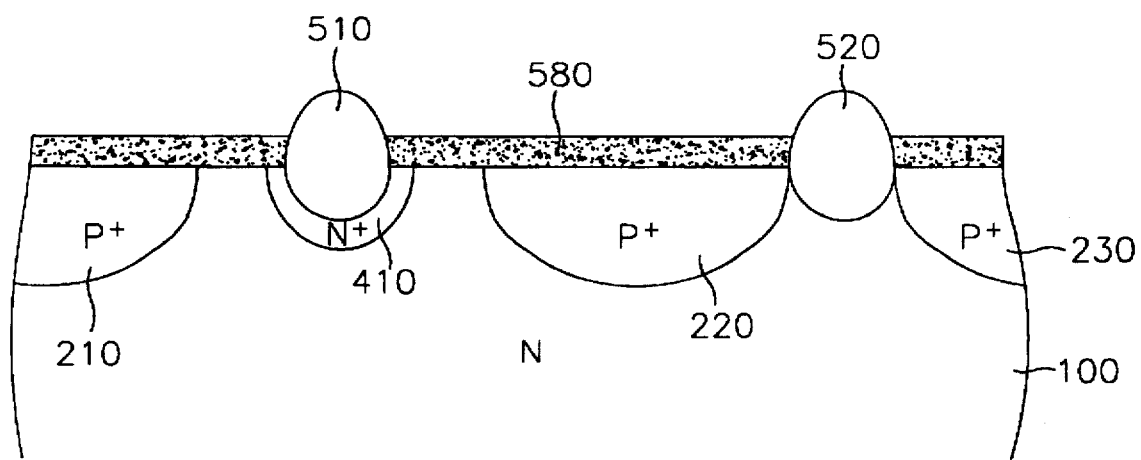
Figure 6E:
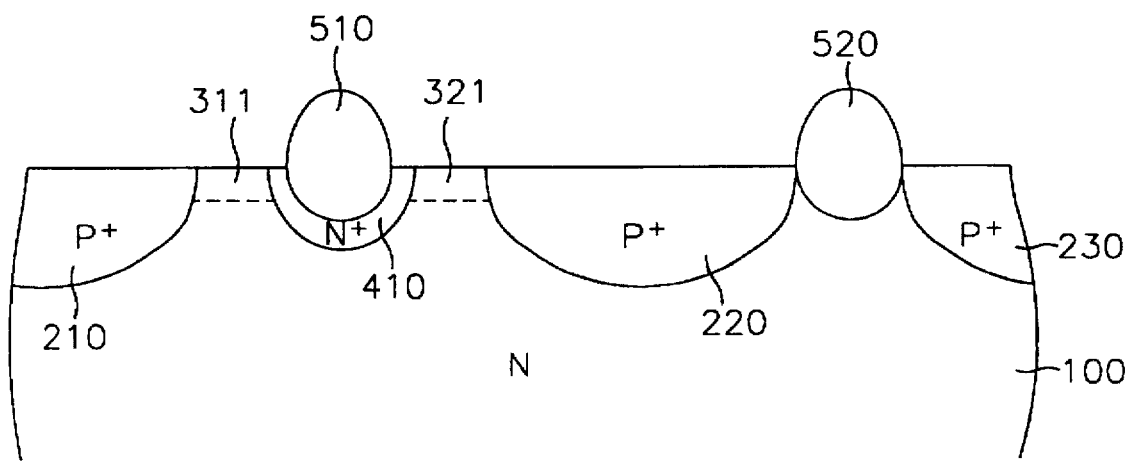
Figure 6F:
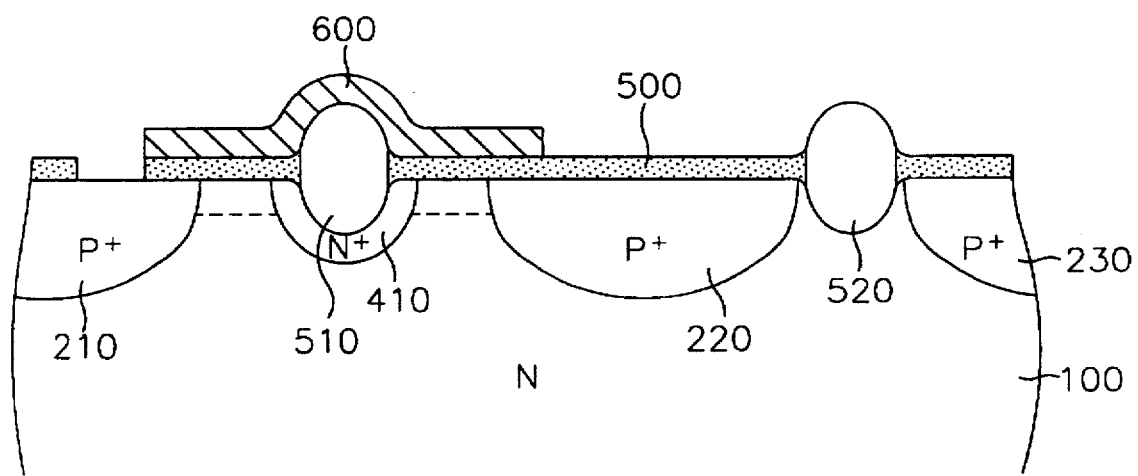
Figure 6G:
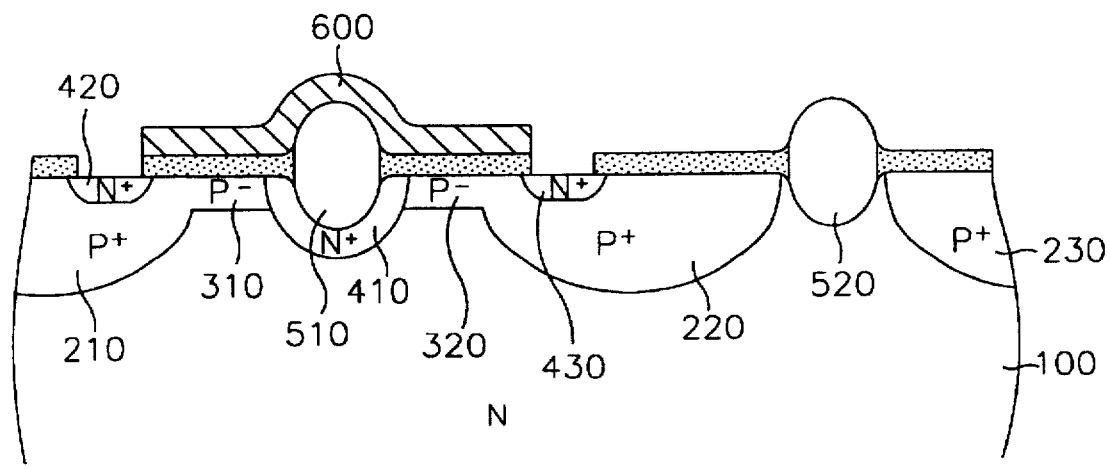
Figure 6H:
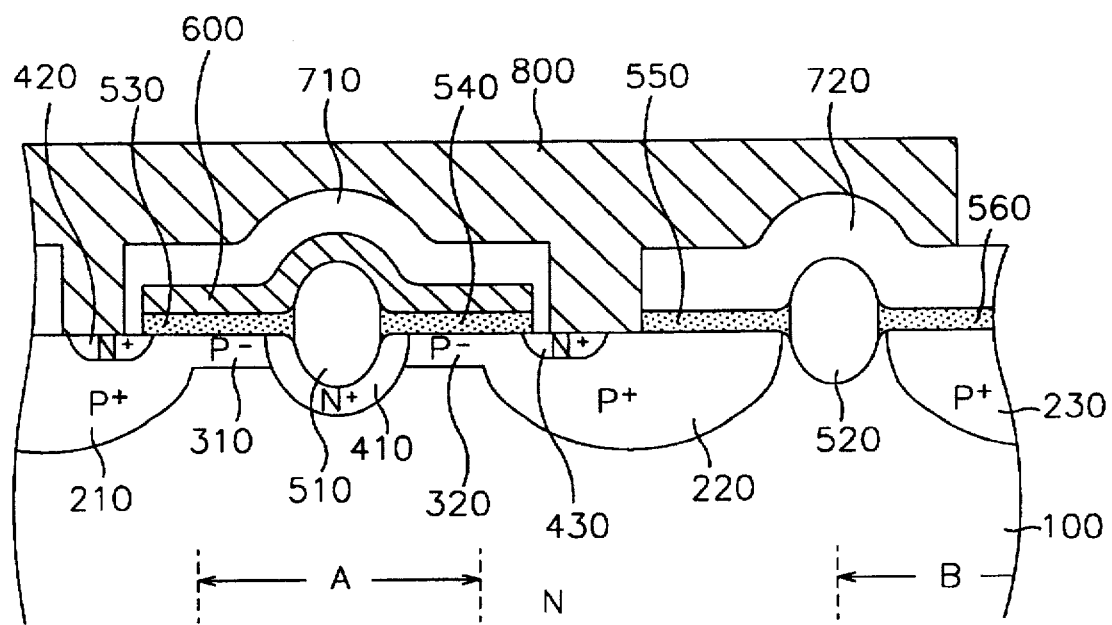
Figure 7:
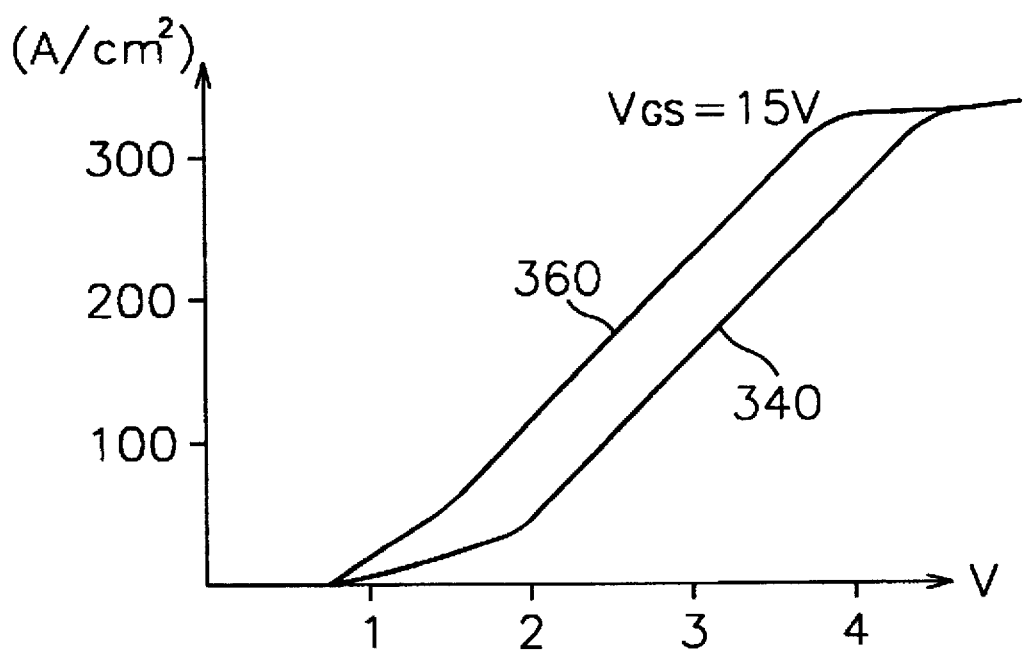

FIGS. 6A to 6H are cross-sectional views showing the steps of the third manufacturing method of an insulated-gate transistor in accordance with the second preferred embodiment of the present invention; and FIG. 7 is a graph comparing the current-voltage characteristics of the insulated-gate transistor according to the present invention against the current voltage characteristics of an insulated-gate transistor in the conventional art.

Figure 2:
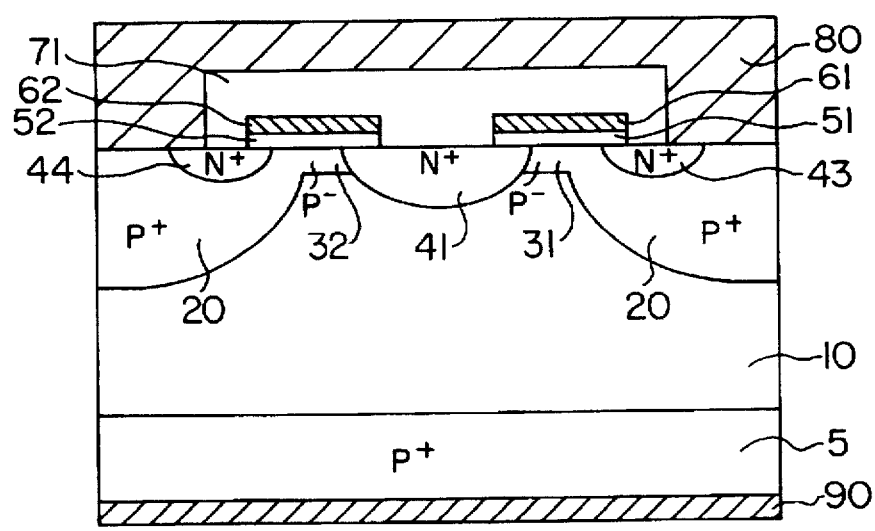
FIG. 2 is a cross-sectional view of a first preferred embodiment of the present invention.
Figure 8A:
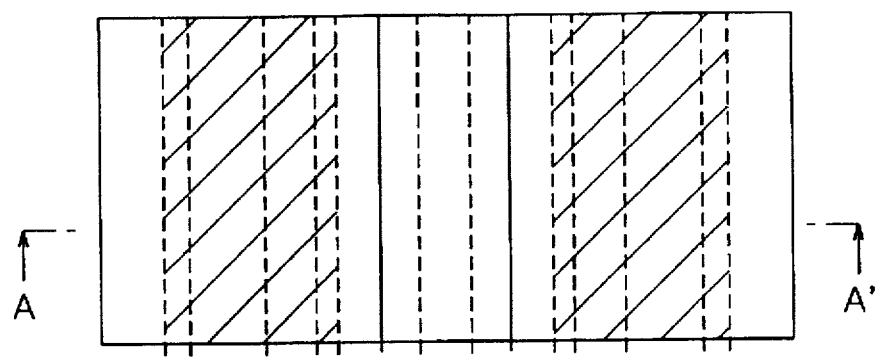

FIG. 8A is another cross-sectional view, adjacent to the view shown in FIG. 2, of the first preferred embodiment of the present invention.

Figure 8B:
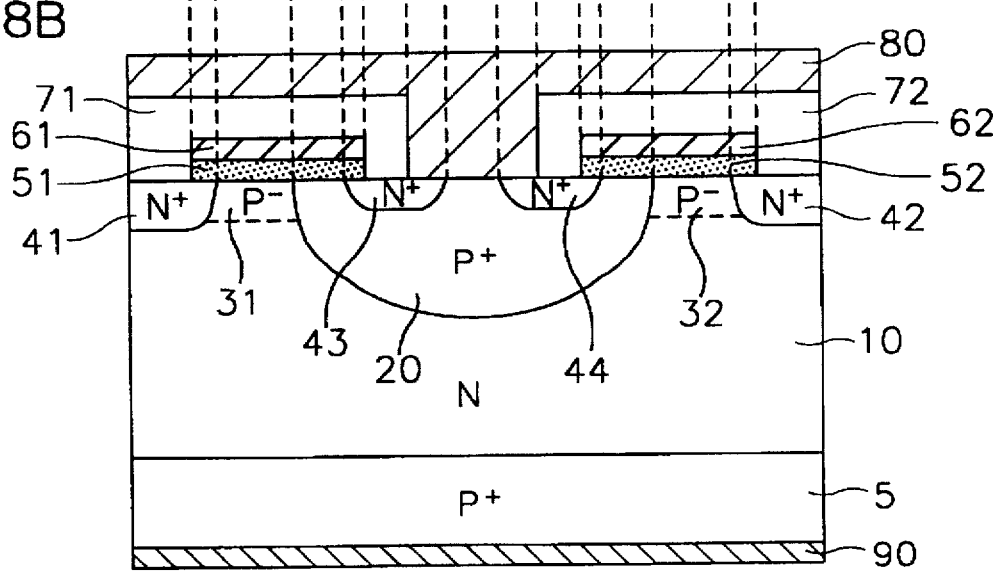

FIG. 8B is a cross-sectional view taken along the A–A' line in FIG. 8A.

DETAILED DESCRIPTION OF THE PREFERRED EMBODIMENTS

FIGS. 2 illustrates the structure of an insulated-gate transistor in accordance with a first preferred embodiment of the present invention.

Figure 1:
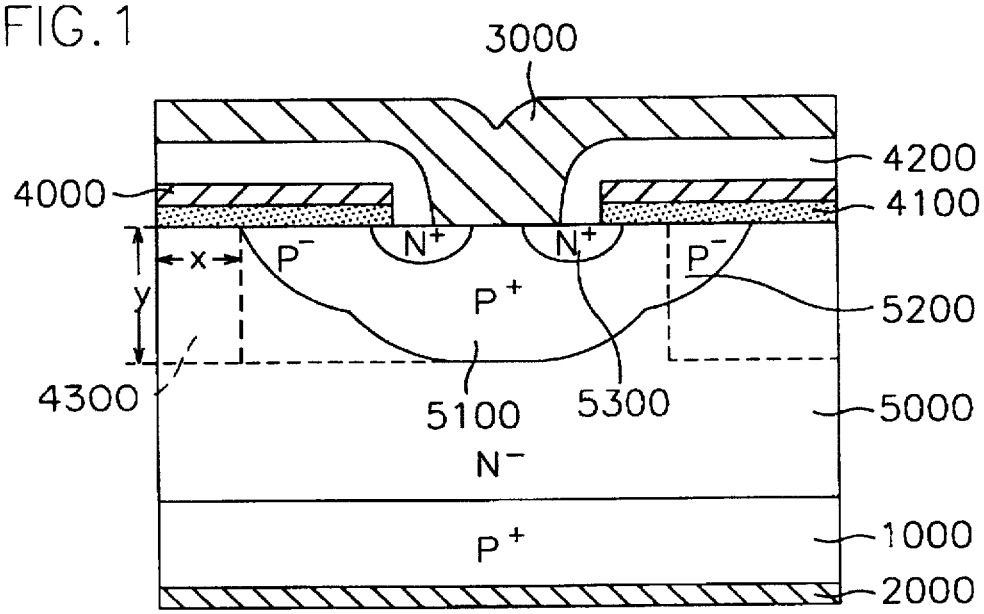
FIG. 1 is a cross-sectional view showing the structure of a conventional insulated-gate transistor.

According to the present invention, the resistance of a conventional JFET region of an insulated-gate transistor can be reduced by forming a plurality of thin $P^-$ layers to be used as channel regions which are different from that of the conventional insulated-gate transistor of FIG. 1 in that the JFET area 4300 is thereby increased.

FIG. 2 shows high density $P^+$ region 20 formed in N-type epitaxial layer 10 which is formed on $P^+$ type substrate 5 having collector electrode 90 underneath the $P^+$ type substrate.

High density emitter $N^+$ regions 43, 44 are formed in $P^+$ region 20 abutting the surface of epitaxial layer 10. Low density $P^-$ type channel regions 31, 32 are formed shallowly on the sides of $P^+$ regions 20. High density isolating $N^+$ region 41, separates channel regions 31 and 32, and is formed more deeply than the channel regions 31, 32 and emitter $N^+$ regions 43, 44.

The impurity density of N-type epitaxial layer 10 can be from $2\times10^{13}/cm^3$ to $5\times10^{16}/cm^3$ and the junction depth of $P^+$ region 20 can be from 2 μm to 7 μm. The surface peak density can be from $10^{18}/cm^3$ to $10^{20}/cm^3$. The surface peak density of $N^+$ regions 41, 43, 44 can be from $10^{19}/cm^3$ to $10^{21}/cm^3$ to $10^{21}/cm^3$ and their junction depth is less than 1 μm. The surface peak density of $P^-$ regions 31, 32 can be from $10^{16}/cm^3$ to $10^{17}/cm^3$ and the impurity density in these regions remains constant in the horizontal direction.

In this case, isolating $N^{30}$ region 41 determines the channel positions by separating channel regions 31, 32 abutted on isolating $N^+$ region 41 and promotes the efficiency of the electrons injected from the channels to the epitaxial layer because its impurity density is higher than that of epitaxial layer 10.

The device of the present invention, as embodied above operates as follows:

If a positive bias is applied to gate electrodes 61, 62, channels are formed in channel regions 31, 32 due to the inversion layer created by the positive bias.

If a positive bias is applied to collector electrode 90, the electrons move out of emitter electrode 80 through the channels and are injected into epitaxial layer 10 passing $N^+$ region 41 which is electrically insulated. The voltage drop due to the JFET effect is reduced because the structure of the JFET as a result of a $P^{31}$ body region is not created.

Consequently, when a high voltage is applied to both channel terminals, it can reduce the total voltage drop produced by the device when the predetermined current flows because the channel current density is increased as compared to the conventional structure.

FIGS. 8A and 8B also show another view, through an adjacent cross-section of the first embodiment of the present invention shown in FIG. 2.

A manufacturing method of the insulated-gate transistor in accordance with a preferred embodiment of the present invention will now be described in accordance with the following detailed description of the accompanying drawings.

FIGS. 3A to 3I are cross-sectional views showing the steps of one method of manufacture of an insulated-gate transistor in accordance with a first preferred embodiment of the present invention. FIGS. 4A and 4B are cross-sectional views showing the steps in a second manufacturing method of an insulated-gate transistor in accordance with the first preferred embodiment of the present invention.

Figure 3A:
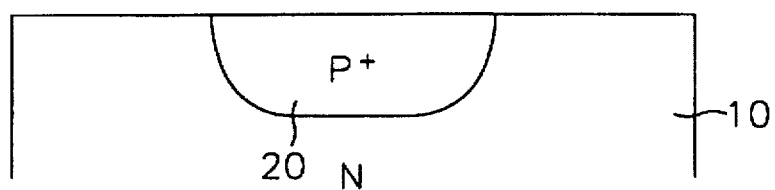
FIGS. 3A to 3I are cross-sectional views showing the steps of the first manufacturing method of an insulated-gate transistor in accordance with a first preferred embodiment of the present invention.
Figure 4A:
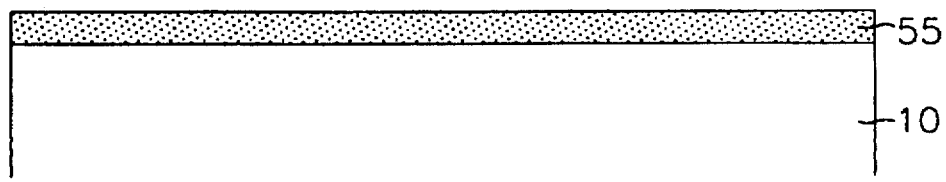
FIGS. 4A to 4C are cross-sectional views showing the steps of the second manufacturing method of an insulated-gate transistor in accordance with the first preferred embodiment of the present invention.
Figure 4B:
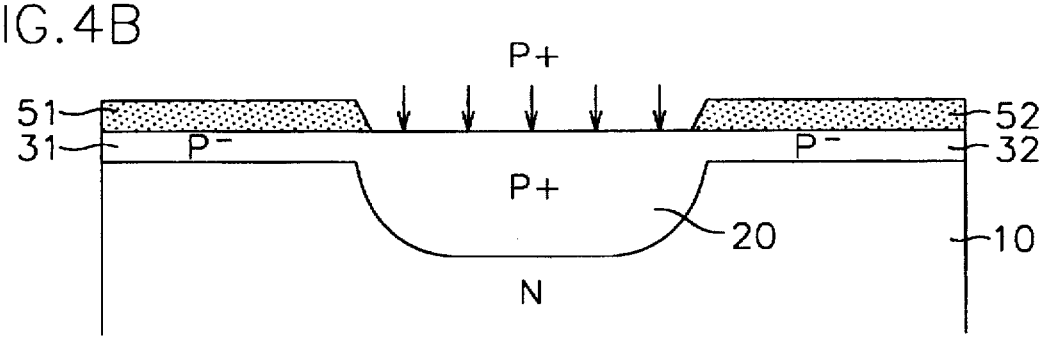

As shown by FIG. 3A, high density $P^+$ region 20 is formed by implanting a P-type dopant such as boron into N-type epitaxial layer 10 on a $P^+$ type substrate (not shown) forming a collector electrode (not shown) under the substrate by a dose between $5 \times 10^{14}$ and $1 \times 10^{16}/cm^3$ by supplying energy of 50 to 200 keV and diffusing it for 200 to 500 minutes between 1000° and 1150° C. In this case, a thin oxide film may be formed in the upper portion of epitaxial layer 10.

Figure 3B:
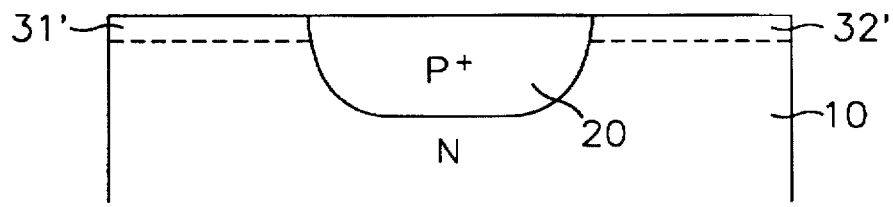

Next, as shown in FIG. 3B, injected ion layers 31', 32' are formed by implanting the P-type dopant into epitaxial layer 10 in a density between $1 \times 10^{11}$ and $1 \times 10^{12}/cm^3$. To form injected ion layers 31, and 32' shallowly, it is desirable to use the thin oxide film created in the previous diffusion step or to form another oxide film on epitaxial layer 10 and then to implant ions into the epitaxial layer with a low energy of between 10 and 20 key through this oxide film.

These steps form thin $P^-$ channels in the epitaxial layer. The produced oxide film is removed by an etchant after completing the ion implanting step.

Figure 3C:
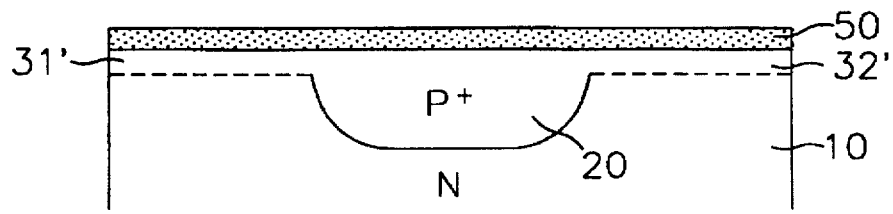

Next, as shown in FIG. 3C, oxide film 50 is formed by oxidizing epitaxial layer 10 to a thickness between 400 and 1000 Å. Since the oxidizing time takes between 50 and 100 minutes to complete and the oxidizing temperature is not very high, the P type dopant in injected ion layer 31', 32 is only slightly diffused into oxide film 50.

Figure 3D:
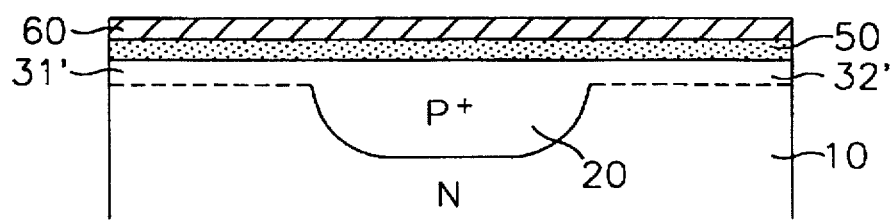

Next, as shown in FIG. 3D, polysilicon layer 60 is deposited on oxide film 50.

Figure 3E:
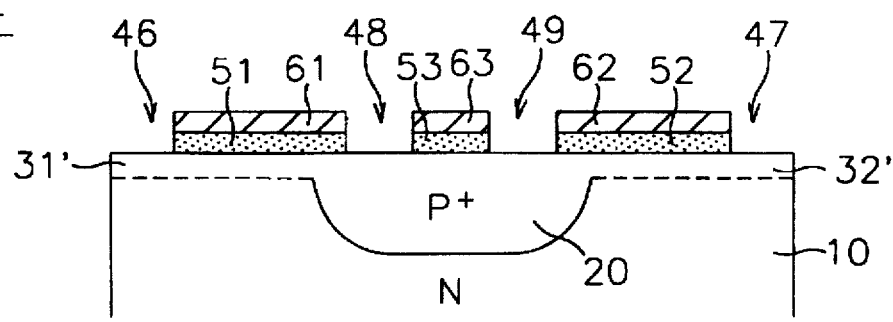

As shown in FIG. 3E the device is coated with a photoresist film (not shown) and exposed to develop it in a predetermined pattern. Openings 46, 47, 48, 49 are then formed by etching polysilicon layer 60 and oxide film 50 through the openings in the photoresist.

In accordance with this preferred embodiment, openings 48, 49 are formed on the upper portion of $P^+$ region 20, and openings 46, 47 are formed respectively on either side of openings 48, 49 above $P^{31}$ regions 31' and 32'.

Parts of the oxide film and polysilicon layer still remain in portions 53, 63 which separate the two openings 48, 49. The oxide film and polysilicon layer also remain in portions 51, 61; and 52, 62 separating the openings 48, 49 formed on the upper portion of $P^+$ region 20 from openings 46, 47, respectively.

Figure 3F:
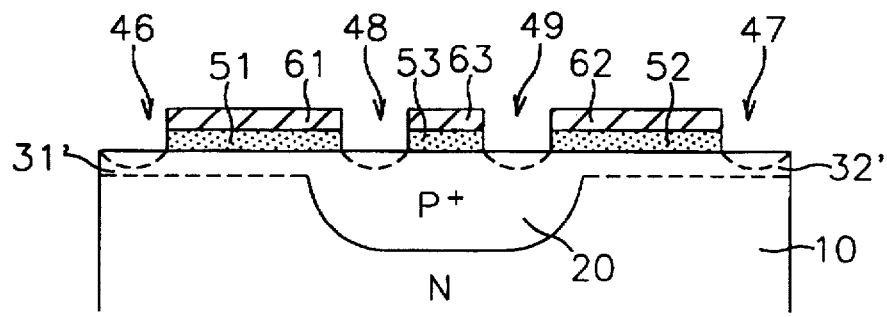

Next, as shown in FIG. 3F, an N-type dopant is implanted into the substrate through the openings (46, 47, 48, 49) by dose between $1 \times 10^{14}$ and $5 \times 10^{15}/cm^3$ with an implanting energy from 10 to 100 kev.

Figure 3G:
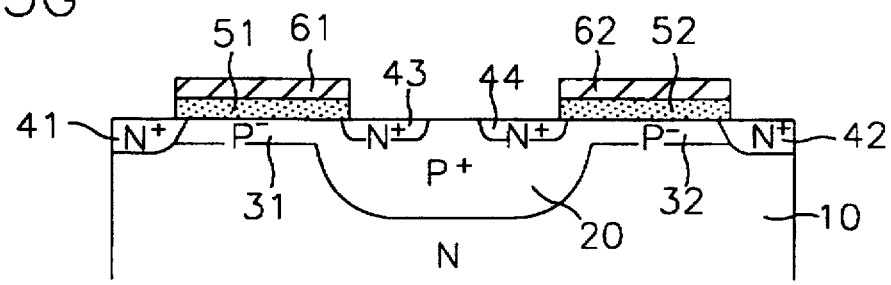

Next, as shown in FIG. 3G, $N^+$ regions 41, 42, 43, 44 are formed by etching away residuary portions 53, 63 of the first oxide film and polysilicon layer which separated openings 48 and 49. A drive-in and a diffusion steps are carried out on the implanted N-type dopant to form $N^+$ regions 41, 42, 43 and 44.

At this time, emitter $N^+$ regions 43, 44, formed by diffusing the injected N type dopant within $P^+$ region 20, are formed shallowly as compared to isolating $N^+$ regions 41, 42 which are formed outside of $P^+$ region 20. The $N^+$ emitter regions 43, 44 should not be on the border between $P^+$ region 20 and channel regions 31, 32 which are formed by lightly diffusing the P-type dopant of injected ion layers 31', 32' as shown in FIG. 3F.

Figure 3H:
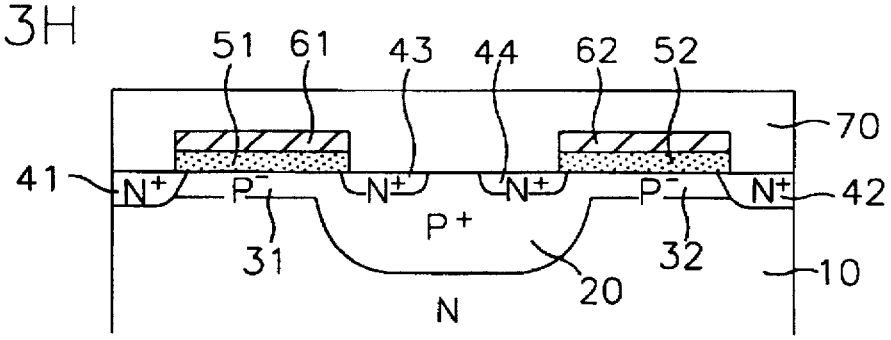

As shown in FIG. 3H, phosphosilicated glass (PSG) layer 70, which is a kind of silicon oxide, is deposited on the entire surface of the device as a passivation layer.

Figure 3I:
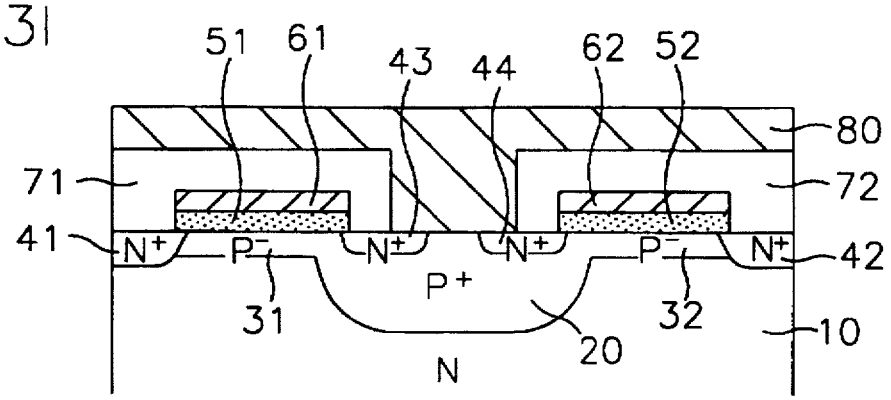

Successively, as shown in FIG. 3I, by patterning and etching, PSG layer 70 is made to cover gate insulating layers 51, 52 and gate electrodes 61, 62 and to reveal emitter $N^+$ regions 43, 44. Finally, the preferred embodiment of the present invention is completed when emitter electrode 80 is formed by depositing the conductive materials on the whole surface of epitaxial layer 10.

On the other hand, in the IGT manufactured in accordance with the steps shown in FIGS. 3A to 3I, channel regions 41, 42 may be formed first and then isolating $N^+$ regions 31, 32 may be formed. Finally, emitter $N^+$ regions 43, 44 may be formed differently from the above method in that high density $N^+$ regions 41, 42, 43, 44 are all formed simultaneously.

However, changing the order of the creation of the $N^+$ regions may change the threshold voltage because the threshold voltage of channels is determined at the edge of polysilicon layer 61, 62 facing emitter $N^+$ regions 43, 44 as shown in FIGS. 3E and 3F.

To obtain a constant threshold voltage, $P^+$ region 20 and emitter $N^+$ regions 43, 44 can be formed using a self-aligning method using the same pattern as in the previous steps on the edge of the polysilicon layer.

Another manufacturing method of the insulated-gate transistor in accordance with the first preferred embodiment of the present invention will be apparent in the following detailed description of FIGS. 4A to 4C.

As shown in FIG. 4A, oxide film 55 with a P-type impurity on N-type epitaxial layer 10 is grown using a Chemical Vapor Deposition (CVD) method.

As shown in FIG. 4B, an opening is made in oxide film 55, a high density P-type impurity is implanted and thermodiffusion is performed. The $P^+$ region 20 is thus formed, and at the same time, thin $P^{31}$ channel regions 31, 32 are formed under residuary oxide films 51, 52 by diffusing the impurities in residuary oxide films 51, 52 after etching.

Figure 4C:
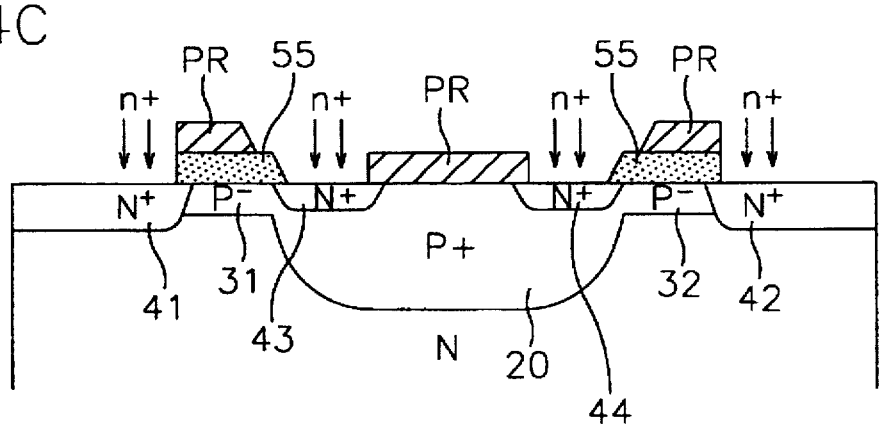

As shown in FIG. 4C, masking is performed through a photoresist film whereby N+ regions 41, 42, 43, 44 are formed using ion implantation. Since emitter $N^+$ regions 43, 44 are formed by diffusing the injected N-type dopant in $P^+$ region 20, they are formed shallowly as compared to isolated $N^+$ regions 41, 42 outside of the $P^+$ region 20. The emitter $N^+$ regions 43, 44 should not border $P^+$ region 20.

After removing the photoresist masking film and oxide film 55 having the P type impurity, the remainder of the insulated-gate transistor is manufactured in accordance with the above mentioned technique. Consequently, the $N^+$ emitter regions and the $P^+$ region can be easily manufactured using a self-align method.

Since the channel regions have a constant horizontal impurity density, it is easy to adjust the threshold voltage. It is also possible to adjust the channel length by changing the location of the $N^+$ openings of isolating $N^+$ regions 41, 42.

In an IGT manufactured using the steps shown in FIGS. 4A to 4C, the $P^-$ channel regions 31, 32 and isolating $N^+$ regions 41, 42 are formed. Finally, emitter $N^+$ regions 43, 44, are formed through the openings in the PSG layer 55 using ion-implantation. This is different in that high density $N^+$ regions 41, 42, 43, 44 are formed simultaneously with no intervening diffusion steps as opposed to the sequential formation in the earlier described steps.

In the insulated-gate transistor of the first preferred embodiment, when a current flows from the collector to the emitter by applying a forward voltage greater than the threshold voltage to the gate, there is no decrease in the breakdown voltage.

However, when the threshold voltage is not applied to the gate, the breakdown voltage decreases because the ability to block the current and voltage of the device is limited. This is a result of the concentration of an electric field at the $N^+/P^+$ junction of the isolating $N^+$ regions 41, 42 and the channel regions 31, 32.

Therefore, the impurity concentration in the isolating $N^+$ regions should be kept low. The voltage applied to the gate electrode on the upper portion of the isolating $N^+$ regions should be kept continuous so as to prevent the electric field concentration phenomenon on the edge of the gate electrode. Furthermore, to reduce the JFET resistance, the isolating $N^+$ regions should be formed as deeply as possible.

To reduce the above difficulties, a field oxide film is formed on the upper portion of the isolating $N^+$ regions. An insulated-gate transistor in accordance with a second preferred embodiment of the present invention will now be described with reference to FIGS. 5 and 6A–6H.

Figure 5:
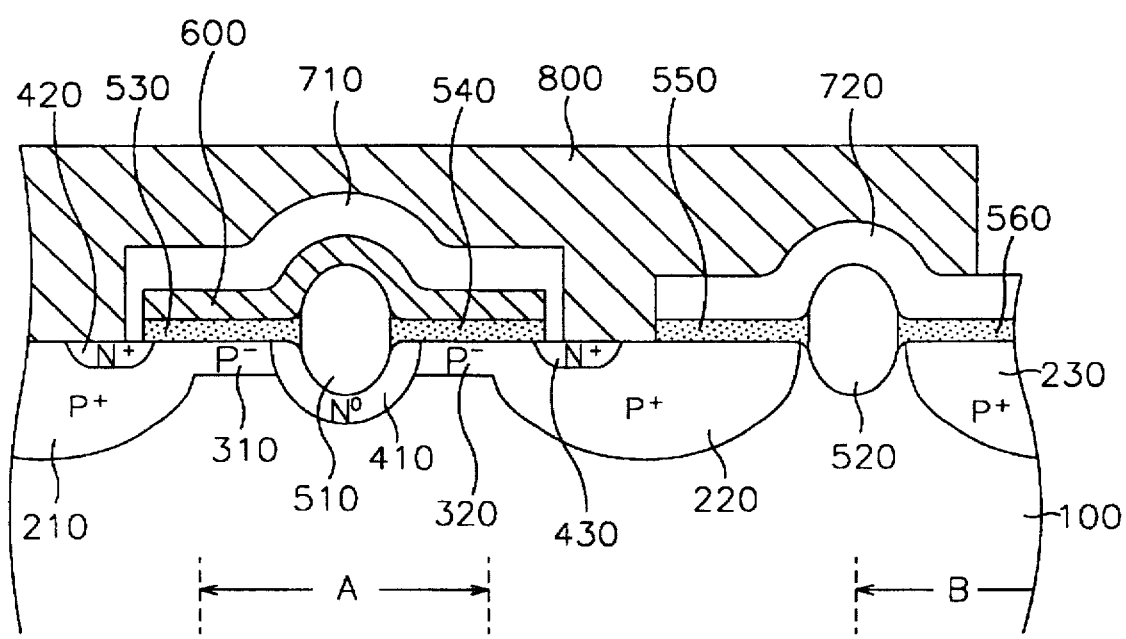
FIG. 5 is a cross-sectional view of an insulated-gate transistor in accordance with a second preferred embodiment of the present invention.

FIG. 5 is a cross-sectional view of a IGT in accordance with the second preferred embodiment of the present invention showing an active region A and guard ring region B. The guard ring B will enhance the breakdown since the breakdown occurs at the corner of the junction due to the concentration of the electric field at the corner.

An epitaxial layer 100 is formed on the upper portion of a substrate (not shown) having a collector underneath (also not shown). $P^+$ regions 210, 220, 230 are formed in epitaxial layer 100 at regular intervals. Field oxide films 510, 520 are formed between $P^+$ regions 210, 220, 230 and medium-concentrated $N^o$ region 411 is formed under alternate field oxide films 510, 520, etc.

Low density $P^{31}$ channel regions 310, 320, are formed between isolating $N^o$ region 411 and $P^+$ regions 210, 220. The isolating $N^o$ region 411 and channel regions 310, 320 comprise the active region A.

High density emitter $N^+$ regions 420, 430 are formed in $P^+$ regions 210, 220 more shallowly than the isolating $N^o$ region and do not exceed the border of $P^+$ regions 210, 220.

In the active region A, oxide films 530, 540 extend from field oxide film 510 to slightly overlay emitter regions 420, 430 and serve as gate insulating layers together with field oxide film 510. Gate electrode 600 is formed on the upper portion of extended oxide films 530, 540.

Gate electrode 600 is completely covered with PSG layer 710. Emitter electrode 800 is then formed over the entire device and emitter electrode 800 is thus connected to $N^+$ emitter regions 420, 430 and $P^+$ regions 210, 220.

The field oxide film 520 is formed outside of the active region and is covered with PSG layer 720.

In using a localized oxidation of silicon (LOCOS) steps, isolating $N^o$ region 411 can be formed deeply and uniformly compared to the first preferred embodiment because isolating $N^o$ region 411 is formed along with field oxide film 510. In so doing, the forward voltage drop can be reduced and the desired breakdown voltage can be obtained when the current is cut off. This is because in the forward blocking mode, a large voltage is applied to the $N^+/P^{31}$ junction shown in FIG. 2 and simultaneously a very high electric field is formed so that a breakdown occurs at the junction. It is well known that the breakdown voltage is enhanced by reducing the doping concentration of the junction. The doping concentration of the N region 410 can be reduced successfully by introducing a LOCOS structure and inducing the breakdown voltage.

The manufacturing method for an IGT in accordance with the second preferred embodiment of the present invention will be apparent from the following detailed description of FIGS. 6A to 6H.

As shown in FIG. 6A, silicon nitride film 590 is formed by depositing silicon nitride $Si_3N_4$ after first forming oxide film 580 by oxidizing N-type epitaxial layer 100 formed on a P type substrate (not shown).

Next, as shown in FIG. 6B, openings 480, 490 are formed by using a photoresist film and exposing and developing it in a predetermined pattern and then etching the oxide film 580 and silicon nitride film 590 through the holes in the photoresist.

An injected-ion region 410 is formed by implanting an N-type dopant such as arsenic into opening 480 by dose of about $1 \times 10^{14}/cm^3$ by supplying an implant energy between 20 and 40 keV. The N-type dopant is not implanted into the other opening 490. Next, the photoresist film is removed.

Referring to FIG. 6C, if LOCOS is performed, oxide films are formed for use as field oxide films in openings 480, 490. During the LOCOS steps, a group V element such as arsenic will gather on the surface of the silicon and will not diffuse in the direction of the oxide film because the segregation coefficient of the oxide film is greater than 1.

Therefore, as first oxide film 510 formed in injected ion layer 410 becomes thicker, the injected ion layer 410 will deepen, but will maintain a predetermined density in order to sustain the doping concentration of $N^o$ region 411.

As shown in FIG. 6D, after the remaining silicon nitride film 590 is removed by etching, the device is coated with a photoresist film, exposed and developed into a predetermined pattern. A P-type dopant is then implanted through the exposed portion, the photoresist film is removed, and the implants are diffused through a drive in steps. The $P^+$ regions 210, 220, 230 are thus formed between first and second field oxide films 510, 520. The rightmost $P^+$ region 230 will be used as a guard ring region.

After removing oxide film 580 with an etchant, a P-type dopant is then implanted into the whole surface of the substrate using a lower dose and energy than when forming the $P^+$ region. As shown in FIG. 6E, injected ion layers 311 and 321 are formed to serve as channels in epitaxial layer 100 surrounding $P^+$ regions 210, 220, 230 and field oxide films 510, 520.

While annealing this structure, oxide film 500 is reformed (shown in FIG. 6F). A polycrystalline silicon gate electrode 600 is then formed by deposition. The polysilicon is then etched so as to cover first field oxide film 510, as shown in FIG. 6F.

After coating the device with a photoresist film and exposing and developing it, the oxide film 500 on upper portion of the $P^+$ regions 210 and 220 is then etched to create an opening above $P^+$ region 210. After implanting an N-type dopant through the opening, removing the photoresist film, and diffusing the structure, high density $N^+$ regions 420, 430 are formed, as shown in FIG. 6G.

The $N^+$ regions 420, 430 should not exceed the border of $P^+$ regions 210, 220. Low density $P^{31}$ regions 310, 320 are also formed by diffusing $P^{31}$ layers 311, 321 (not shown on FIG. 6G).

As shown in FIG. 6H, PSG films 710, 720 are deposited and etched to reveal $N^+$ emitter regions 420, 430 and $P^+$ regions 210, 220. Finally, this preferred embodiment will be completed by forming emitter electrode 560 by depositing electrically conductive materials over the entire structure.

FIG. 7 illustrates the current-voltage characteristics of the insulated-gate transistor according to the first and second preferred embodiments of the present invention. Reference numbers 360 and 340 illustrate the current-voltage characteristics of the insulated-gate transistor according to the present invention and the conventional art respectively.

In accordance with the present invention, $V_{ce.Sat}$ is reduced by more than 0.5 V compared to the conventional sample when a $V_{gs}$ (voltage between a gate and a source) of 15 V is applied.

As described above, in accordance with the insulated-gate transistor and manufacturing method thereof according to the preferred embodiment of the present invention, the switching characteristics can be improved by reducing the input and reverse capacitances. The forward voltage drop can also be reduced by reducing the resistance through the first conductive type semiconductor region which is determined by the distance between two adjacent second conductive type semiconductor regions in its forward turn-on state.

What is claimed is:

1. A method for manufacturing a power insulated-gate transistor having three terminals, and including a first conductive type semiconductor layer disposed on a second conductive type semiconductor substrate, said method comprising the steps of:

forming a first region by injecting in high density an impurity of said second conductive type into said semiconductor layer;

injecting in low density an impurity of said second conductive type into said semiconductor layer;

forming an insulating layer and a conductive layer on said semiconductor layer;

forming openings on opposite sides of said first region by etching the insulating layer and the conductive layer;

forming a plurality of second regions by injecting in high density an impurity of said first conductive type into said semiconductor layer through said openings; and forming a plurality of third and fourth regions by diffusing the impurity of said second conductive type that was injected into said semiconductor layer and diffusing the impurity of said first conductive type that was injected into the semiconductor layer through said openings, wherein said fourth region is formed more deeply in said semiconductor layer than said third region.

2. The manufacturing method as in claim 1, wherein:

when forming openings on opposite sides of said first region by etching the insulating layer and the conducting layer, a plurality of openings are also formed above the first region; and a plurality of second regions are formed by diffusing the first conductive type impurity injected in high density into said first region through said openings above said first region.

3. A method for manufacturing a power insulated-gate transistor having three terminals, and including a first conductive type semiconductor layer disposed on a second conductive type semiconductor substrate, said method comprising the steps of:

forming a first region by injecting in high density an impurity of said second conductive type into said semiconductor layer;

injecting in low density an impurity of said second conductive type into the semiconductor layer;

injecting in high density an impurity of said first conductive type on opposite sides of said first region; and forming a plurality of second regions by injecting in high density an impurity of said first conductive type into said semiconductor layer;

forming a plurality of third regions by diffusing said second conductive type impurity injected in low density into the semiconductor layer; and forming a plurality of fourth regions by diffusing said first conductive type impurity injected in high density on opposite sides of said fist region, and forming said plurality of fourth regions more deeply than said plurality of third regions.

4. The manufacturing method of a power insulated-gate transistor as in claim 3, wherein the steps in which a first conductive type impurity is injected in high density on opposite sides of said first region further comprises the steps of:

coating said semiconductor layer with a photoresist film;

exposing a portion of the semiconductor layer on opposite sides of said first region by exposing and developing the photoresist film;

injecting in high density an impurity of said first conductive type into the semiconductor layer; and removing said photoresist film.

5. A method for manufacturing a power insulated-gate transistor having three terminals, and including a semiconductor layer of a first conductive type disposed on a second conductive type semiconductor substrate, said method comprising the steps of:

forming an insulating layer having a second conductive type impurity on a semiconductor layer;

forming a plurality of openings by etching the insulating layer;

injecting in high density an impurity of said second conductive type into said semiconductor layer through said openings;

forming a plurality of first regions in high density in the semiconductor layer underneath the openings by diffusing previously injected second conductive type impurity in high density;

forming a plurality of second regions in low density more shallowly than the first regions in the semiconductor layer underneath said insulating layer; and forming a number of third regions more deeply than said second regions by injecting in high density an impurity of said first conductive type into each of said second regions.

6. The manufacturing method of a power insulated-gate transistor as in claim 5, wherein said method further comprising:

forming a plurality of fourth regions more shallowly than said first region by injecting in high density an impurity of said first conductive type into said first region.

7. A method for manufacturing a power insulated-gate transistor having three terminals, and including a first conductive type semiconductor layer disposed on a second conductive type semiconductor substrate, said method comprising the steps of:

depositing an oxide insulating layer and a silicon nitride insulating layer respectively on said semiconductor layer;

forming a plurality of openings by etching the oxide insulating layer and the silicon nitride insulating layer;

injecting in high density an impurity of said first conductive type into the semiconductor layer through said openings;

forming a field oxide film on said exposed semiconductor layer through said openings;

forming a plurality of first regions by diffusing the high density of said first conductive type impurity injected through the openings;

removing the silicon nitride semiconductor layer;

forming a second region by injecting in high density an impurity of said second conductive type into the semiconductor layer and then diffusing said injected impurity;

removing said oxide insulating layer; and injecting in low density an impurity of said first conductive type into the semiconductor layer.

8. The manufacturing method of a power insulated-gate transistor as in claim 7, wherein after injecting a low density first conductive type impurity into the semiconductor layer said method further comprising the steps of:

forming an insulating layer by depositing insulating materials on the semiconductor layer;

forming a gate electrode by depositing electrically conductive materials on the insulating layer;

forming a plurality of openings by etching the insulating layer of the of the second region; and forming a plurality of third regions by injecting in high density an impurity of said first conductive type into the second region through said openings.

9. The manufacturing method of a power insulated-gate transistor as in claims 7 or 8 wherein a LOCOS (localized oxidation of silicon) steps is used for forming an oxidized field oxide film on the exposed semiconductor layer through said openings.

* * * * *